United States Patent
Marumo et al.

(10) Patent No.: US 6,639,307 B2
(45) Date of Patent: Oct. 28, 2003

(54) COVER TAPE FOR PACKAGING ELECTRONIC ELEMENTS

(75) Inventors: Tsuyoshi Marumo, Tokyo (JP); Hisao Nakanishi, Tokyo (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 0 days.

(21) Appl. No.: 10/325,447

(22) Filed: Dec. 19, 2002

(65) Prior Publication Data

US 2003/0127726 A1 Jul. 10, 2003

(30) Foreign Application Priority Data

Jan. 9, 2002 (JP) ........................ 2002-002068

(51) Int. Cl.[7] ............................... H01L 21/60
(52) U.S. Cl. ............................................ 257/668
(58) Field of Search ........................... 257/702, 668

(56) References Cited

U.S. PATENT DOCUMENTS

| 4,169,181 A | 9/1979 | Molari, Jr. |
| 4,360,562 A | 11/1982 | Endo et al. |
| 5,386,624 A * | 2/1995 | George et al. |
| 5,578,527 A * | 11/1996 | Chang et al. |
| 5,604,380 A | 2/1997 | Nishimura et al. |
| 6,495,768 B1 * | 12/2002 | Cho |

FOREIGN PATENT DOCUMENTS

DE 196 17 621 11/1997

OTHER PUBLICATIONS

European Search Report, dated Mar. 6, 2003, issued by the European Patent Office, for European Patent Application No. EP 03000018.6 (3 pages).

* cited by examiner

*Primary Examiner*—Stephen D. Meier
(74) *Attorney, Agent, or Firm*—Smith, Gambrell & Russell, LLP

(57) ABSTRACT

A cover tape for packaging electronic elements capable of being heat-sealed to a polycarbonate carrier tape having regularly formed pockets for containing electronic elements, which cover tape comprises (A) a substrate layer comprising a thermoplastic resin having a load deflection temperature (ASTM D-648) under a load of 1.82 MPa of not lower than 60° C., and (B) a heat seal layer comprising at least one resin selected from polyvinyl chloride resin, polyester resin, polyurethane resin, acrylic resin containing a functional group and ethylene copolymer which have a Tg of 30–60° C., and an electroconductive fine powder dispersed in said resin.

7 Claims, 1 Drawing Sheet

COVER TAPE FOR PACKAGING ELECTRONIC ELEMENTS

TECHNICAL FIELD

The present invention relates to a cover tape capable of being sealed to a polycarbonate carrier tape having pockets for containing electronic elements among packaging materials having functions of protecting electronic elements from contamination, arranging them for mounting on the surface of electronic circuit substrates and taking out them in storing, transporting and mounting the electronic elements.

BACKGROUND ART

Electronic elements to be surface-mounted, such as IC, transistors, diodes, condensers, piezoelectric resistors, etc. have been packaged with packaging materials comprising a plastic carrier tape having pockets regularly formed by embossing in conformity with the shape of the electronic elements, and a cover tape capable of being sealed to the carrier tape, and the resulting packages have been put to use. The electronic elements contained therein can be automatically taken out after peeling off the cover tape of the package, and can be surface-mounted on an electronic circuit substrate.

The mounting techniques have been yearly developed and are required to be high in precision of mounting, and it has been attempted to enhance production efficiency. Therefore, miniaturization of the elements to be mounted and speeding up of mounting have been rapidly spread, and as for the carrier tapes, decrease in width and increase in length thereof have been carried out. As materials of carrier tapes meeting the commercial demand, particularly polycarbonates have attracted public attention. This is because they are strong in rigidity and have heat resistance which can withstand heat sealing.

With decrease in width of carrier tapes, width of sealing trowel has been narrowed, and furthermore, with speeding up of mounting, the time for sealing to cover tapes has been gradually shortened to less than 1 second. Therefore, in order to obtain desired peel strength, the sealing temperature must be raised. Especially, sealing temperature for polycarbonate carrier tapes must be higher than sealing temperature for other plastic carrier tapes, and the heat sealing is carried out at about 200° C. That is, sealing temperature must be changed depending on the materials of carrier tapes, which is one cause of reduction in production efficiency. Moreover, it is difficult to further raise sealing temperature and this is a problem which hinders speeding up of mounting operation.

DISCLOSURE OF INVENTION

The object of the present invention is to provide an electrically conductive cover tape which is excellent in transparency and can be heat-sealed, at a sealing temperature lower by at least 30° C. than the presently employed sealing temperature even with narrow trowel width and shortened sealing time, to a polycarbonate carrier tape which has required a heat sealing temperature of about 200° C.

The present invention relates to the following cover tapes.

(1) A cover tape for packaging electronic elements which can be heat-sealed to a polycarbonate carrier tape having regularly formed pockets for containing electronic elements, which cover tape comprises (A) a substrate layer comprising a thermoplastic resin having a load deflection temperature (ASTM D-648) under a load of 1.82 MPa of not lower than 60° C., and (B) a heat seal layer comprising at least one resin selected from polyvinyl chloride resin, polyester resin, polyurethane resin, acrylic resin containing a functional group and ethylene copolymer which have a Tg of 30–60° C., and an electroconductive fine powder dispersed in said resin.

(2) A cover tape for packaging electronic elements mentioned in (1), wherein the layer A has a thickness of 6–100 μm and comprises polycarbonate, polyether sulfone, polyether imide, polyimide, nylon, polyester or polypropylene.

(3) A cover tape for packaging electronic elements mentioned in (1) or (2), wherein at least one layer selected from the group consisting of a polyester layer, a nylon layer, a polypropylene layer, a polyethylene layer and an ethylene copolymer layer is laminated between the layer A and the layer B.

(4) A cover tape for packaging electronic elements mentioned in (1), (2) or (3), wherein the comonomer of the ethylene copolymer mentioned in (1) and (3) is one member selected from the group consisting of vinyl acetate, acrylic acid, acrylate esters, methacrylic acid, methacrylate esters and ionomers.

(5) A cover tape for packaging electronic elements mentioned in (1), (2), (3) or (4), wherein the polycarbonate carrier tape has an electroconductive material incorporated and kneaded therein or coated on the surface of the tape.

(6) A cover tape for packaging electronic elements mentioned in (1), (2), (3), (4) or (5), wherein the electroconductive fine powder contained in the layer B consists of at least one member selected from tin oxide, zinc oxide, titanium oxide and carbon black, and the surface of the seal layer B has a resistivity of not more than $1 \times 10^{13} \Omega/\square$.

(7) A cover tape for packaging electronic elements mentioned in (1), (2), (3), (4), (5) or (6) which has a total light transmittance of not less than 70% and a haze of not more than 60%.

Figure 1:
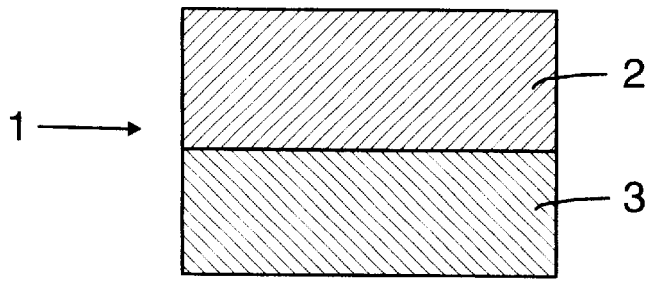
FIG. 1 is a sectional view which shows a layer construction of the cover tape of the present invention.

The reference numerals used in FIGS. 1–4 have the following meanings.

1: Cover tape
2: Substrate layer (layer A)
3: Heat seal layer (layer B)
4: Intermediate layer
5: Isocyanate adhesive layer
6: Portion to be heat-sealed
7: Carrier tape

DETAILED DESCRIPTION OF THE INVENTION

One example of the constitution of the cover tape according to the present invention will be explained referring to FIG. 1. The layer A is a transparent film of high rigidity which comprises a thermoplastic resin having a load deflection temperature (ASTM D-648) under a load of 1.82 MPa of not lower than 60° C., especially, polycarbonate, polyether sulfone, polyether imide, polyimide, nylon, polyester or polypropylene and which has a thickness of 6–100 μm. If the load deflection temperature is lower than 60° C., the cover tape sometimes melts at the time of high-temperature sealing, which may cause troubles such as failure in sealing. If the thickness of the layer A is less than 6 μm, the rigidity is lost, and if it exceeds 100 μm, the layer becomes too hard and sealing becomes unstable. Preferred is a film having a thickness of 10–60 μm. An antistatic treatment layer or an electrically conductive layer may be provided on the surface of the layer A for the purpose of enhancing antistatic effect.

In order to increase mechanical strength of the cover tape, at least one layer selected from the group consisting of a polyester layer, a nylon layer, a polypropylene layer, a polyethylene layer and an ethylene copolymer layer may be provided between the layer A and the layer B. The comonomer contained in the ethylene copolymer is preferably selected from vinyl acetate, acrylic acid, acrylate esters, methacrylic acid, methacrylate esters and ionomers.

If there is no severe limitation in cost, the layer A or the above polyester layer, nylon layer, polypropylene layer, polyethylene layer and ethylene copolymer layer may be stretched for further increase of heat resistance and mechanical strength.

Furthermore, in order to increase bond strength between the respective layers, there may be provided polyethylene, ethylene copolymer, polyurethane adhesive or epoxy adhesive, and, if necessary, the bond strength can be improved by carrying out corona treatment, plasma treatment, or sandblast treatment.

The layer B is a heat seal layer comprising at least one resin selected from polyvinyl chloride resin, polyester resin, polyurethane resin, acrylic resin having a functional group and ethylene copolymer which have a Tg of 30–60° C., and an electroconductive fine powder dispersed in said resin. If Tg of the base resin is lower than 30° C., blocking occurs during storage at room temperature, which causes problems. If Tg is higher than 60° C., heat sealability at low temperatures to the polycarbonate carrier tape is deteriorated and no sufficient peel strength can be obtained. In the case of the acrylic resin, if this has no functional group, the low-temperature heat seal characteristics cannot be exhibited even when Tg is in the range of 30–60° C.

The electroconductive fine powder is uniformly dispersed in the heat seal layer, and the surface resistivity is desirably adjusted to not higher than $10^{13}\Omega/\square$. The surface resistivity is preferably $10^6$–$10^9\Omega/\square$. If the surface resistivity is higher than $10^{13}\Omega/\square$, no effective antistatic effect can be obtained to cause the problems that the packaged electronic elements are broken or the electronic elements stick to the cover tape due to generation of static electricity at the time of mounting. The electroconductive fine powder includes, for example, tin oxide, zinc oxide, titanium oxide, carbon black, etc. The desired effect can be obtained even by using them each alone, but they may be used in combination of two or more.

It is desired to form the cover tape by lamination so that the total light transmittance is not less than 70% and the haze is not more than 60%. If the total light transmittance is less than 70% and the haze is more than 60%, it is difficult to inspect or confirm visually or with machines whether the electronic elements are correctly inserted after the electronic elements are packaged with the cover tape, and therefore troubles are apt to occur.

The polycarbonate carrier tape used in the present invention preferably contains an electroconductive material incorporated and kneaded therein or is coated with an electroconductive agent (electroconductive fine powder, antistatic agent or the like) on the surface for the purpose of inhibiting electrostatic rupture of electronic elements.

Moreover, for modification of polycarbonate, other resins, rubber components, pigments, stabilizers, etc. may be incorporated and kneaded therein in such an amount that the pockets can be formed.

BEST MODE FOR CARRYING OUT THE INVENTION

Examples of the present invention will be shown below, but they should not be construed as limiting the present invention in any manner.

Examples 1–8 and Comparative Examples 1–6

The substrate layer (the first layer corresponding to the layer A in the present invention) mentioned in Tables 1 and 2 and the second layer—the fifth layer mentioned in Tables 1 and 2 were, if necessary, subjected to a surface treatment such as corona treatment, plasma treatment or sandblast treatment, and were laminated by a method such as extrusion lamination, dry lamination or co-extrusion. The heat seal layer (corresponding to the layer B in the present invention) was formed from solution at a film thickness of 2 μm by a roll coater to obtain a cover tape. The numeral given at the right of the name of each layer in Tables 1 and 2 means thickness of the layer (unit: μm).

The resulting cover tape was slit in a width of 5.5 mm, and then sealed to a polycarbonate carrier tape of 8 mm in width at a sealing temperature of 160° C., followed by being subjected to measurement of peel strength and electric characteristics, blocking test, visual examination of the electronic elements contained therein and the surface state of the substrate layer, and the like. The results are shown in Tables 1 and 2.

Peeling Conditions

Peeling angle: 180°; Peeling speed: 300 mm/min; The number of samples: n=3.

Blocking Test

The samples were stored at 23° C. and 50% RH, 40° C. and 90% RH, and 50° C. and 10% RH or lower, and inspection was conducted on whether blocking occurred or not.

○: The sample was practically usable as a product.

x: The sample was practically unusable as a product.

Examination of the Surface State of the Substrate Layer

Sealing was carried out under the above heat sealing conditions, and thereafter the state of the sealed substrate surface was examined.

○: Problems such as melting of the substrate surface were not seen.

x: Problems such as melting of the substrate surface were seen.

Visual Examination of the Contained Electronic Elements

After sealing was carried out under the heat sealing conditions, examination was conducted on whether the number given on the contained electronic elements could be visually confirmed or not.

○: The number given on the contained electronic elements could be visually confirmed.

x: The number given on the contained electronic elements could not be visually confirmed.

PES: Polyether sulfone
PEI: Polyether imide

TABLE 1

Figure 2:
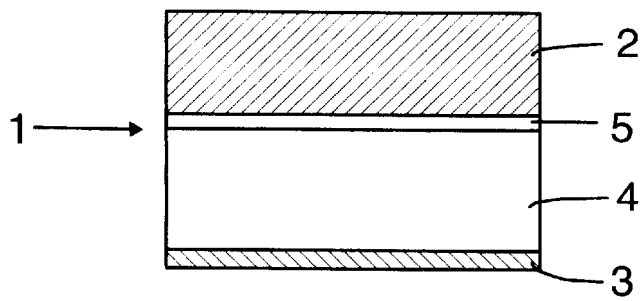
FIG. 2 is a sectional view which shows a layer construction of the cover tapes described in the Examples of the present invention.
Figure 3:
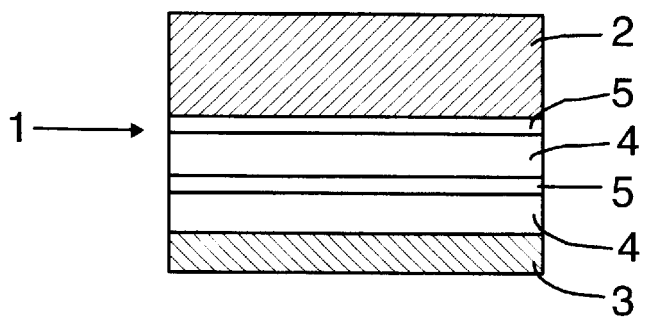
FIG. 3 is a sectional view which shows another layer construction of the cover tapes described in the Examples of the present invention.
Figure 4:
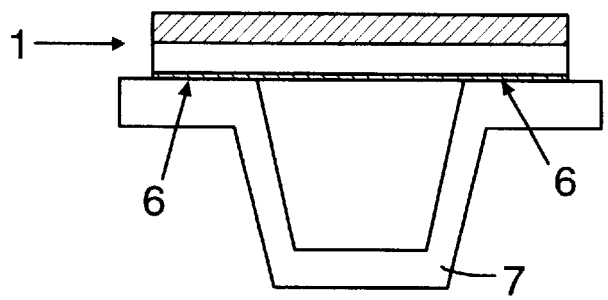
FIG. 4 is a sectional view which shows the state of the cover tape of the present invention being adhered to a carrier tape, namely, the state of the cover tape being used.

| | Exam. 1 | | Exam. 2 | | Exam. 3 | | Exam. 4 | | Exam. 5 | | Exam. 6 | | Exam. 7 | | Exam. 8 | |
|---|---|---|---|---|---|---|---|---|---|---|---|---|---|---|---|---|
| The first layer (layer A) | PC | 90 | PC | 50 | PC | 6 | Ny | 25 | PBT | 30 | PES | 9 | PET | 9 | PEI | 12 |
| (Load deflection temperature °C.) | (134) | | (134) | | (134) | | (63) | | (80) | | (210) | | (71) | | (210) | |
| The second layer | No | | No | | DL | 2 | DL | 2 | DL | 2 | DL | 2 | DL | 2 | DL | 2 |
| The third layer | No | | No | | PE | 50 | PE | 30 | PE | 30 | PP | 30 | PP | 30 | Ny | 30 |
| The fourth layer | No | | No | | No | | No | | No | | DL | 2 | DL | 2 | DL | 2 |
| The fifth layer | No | | No | | No | | No | | No | | PE | 25 | PE | 25 | EVA | 25 |
| Heat seal layer (layer B) | Ester | 2 | PVC-VA | 2 | X-PMMA | 2 | PVC-VA | 2 | PVC-VA | 2 | X-PMMA | 2 | PVC-VA | 2 | Urethane | 2 |
| (Tg: °C.) | 43 | | 35 | | 50 | | 45 | | 35 | | 50 | | 55 | | 45 | |
| Electroconductive agent | $SnO_2$ | | $SnO_2$ | | $SnO_2$ | | $TiO_2$ | | $SnO_2$ | | $SnO_2$ | | $SnO_2$ | | $ZnO$ | |
| Layer construction | FIG. 1 | | FIG. 1 | | FIG. 2 | | FIG. 2 | | FIG. 2 | | FIG. 3 | | FIG. 3 | | FIG. 3 | |
| Surface resistivity ($\Omega/\square$) | $10^9$ | | $10^8$ | | $10^9$ | | $10^{10}$ | | $10^9$ | | $10^9$ | | $10^9$ | | $10^{11}$ | |
| Total light transmittance (%) | 82.2 | | 88.9 | | 87.2 | | 85.2 | | 83.4 | | 79.8 | | 78.8 | | 77.3 | |
| Haze (%) | 18.3 | | 15.1 | | 15.3 | | 18.3 | | 19.2 | | 24.3 | | 28.6 | | 34.2 | |
| Peel strength (g) | 53 | | 55 | | 32 | | 43 | | 48 | | 28 | | 35 | | 41 | |
| Blocking test | ○ | | ○ | | ○ | | ○ | | ○ | | ○ | | ○ | | ○ | |
| Surface state of substrate layer | ○ | | ○ | | ○ | | ○ | | ○ | | ○ | | ○ | | ○ | |
| Visual examination of contained elements | ○ | | ○ | | ○ | | ○ | | ○ | | ○ | | ○ | | ○ | |

TABLE 2

| | Comp. Exam. 1 | | Comp. Exam. 2 | | Comp. Exam. 3 | | Comp. Exam. 4 | | Comp. Exam. 5 | | Comp. Exam. 6 | |
|---|---|---|---|---|---|---|---|---|---|---|---|---|
| The first layer (layer A) | PC | 105 | PC | 4 | PC | 50 | PC | 50 | PET | 30 | PET | 9 |
| (Load deflection temperature °C.) | (134) | | (134) | | (134) | | (134) | | (71) | | (71) | |
| The second layer | No | | DL | 2 | No | | No | | DL | 2 | DL | 2 |
| The third layer | No | | PE | 50 | No | | No | | PE | 30 | PP | 30 |
| The fourth layer | No | | No | | No | | No | | No | | DL | 2 |
| The fifth layer | No | | No | | No | | No | | No | | PE | 25 |
| Heat seal layer (layer B) | X-PMMA | 2 | X-PMMA | 2 | X-PMMA | 2 | X-PMMA | 2 | PMMA-BMA | 2 | SBS | 2 |
| (Tg: °C.) | 50 | | 50 | | 20 | | 65 | | 50 | | 50 | |
| Electroconductive agent | $SnO_2$ | | $SnO_2$ | | $SnO_2$ | | $SnO_2$ | | $SnO_2$ | | $SnO_2$ | |
| Layer construction | FIG. 1 | | FIG. 2 | | FIG. 1 | | FIG. 1 | | FIG. 2 | | FIG. 3 | |
| Surface resistivity ($\Omega/\square$) | $10^9$ | | $10^8$ | | $10^9$ | | $10^{10}$ | | $10^9$ | | $10^9$ | |
| Total light transmittance (%) | 80.3 | | 86.3 | | 89.3 | | 90.1 | | 81.2 | | 76.3 | |
| Haze (%) | 22.2 | | 15.1 | | 15.3 | | 14.7 | | 20.2 | | 26.7 | |
| Peel strength (g) | 5 | | 3 | | 100 | | 2 | | 2 | | 1 | |
| Blocking test | ○ | | ○ | | × | | ○ | | ○ | | ○ | |
| Surface state of substrate layer | ○ | | × | | ○ | | ○ | | ○ | | ○ | |
| Visual examination of contained elements | ○ | | ○ | | ○ | | ○ | | ○ | | ○ | |

The symbols shown in Tables 1 and 2 have the following meanings.

PC: Polycarbonate
PET: Polyethylene terephthalate
PBT: Polybutylene terephthalate
PP: Polypropylene
Ny: Nylon
PE: Low density polyethylene
EVA: Ethylene-vinyl acetate copolymer
DL: Dry lamination adhesive layer (isocyanate adhesive layer)
Ester: Polyester resin
Urethane: Polyurethane resin
X-PMMA: Polymethyl methacrylate modified with a functional group SBS: Styrene-butadiene-styrene copolymer
PMMA-BMA: Methyl methacrylate-butyl methacrylate copolymer
PVC-VA: Vinyl chloride-vinyl acetate copolymer
$SnO_2$: Tin oxide
$TiO_2$: Titanium oxide
ZnO: Zinc oxide As clear from Table 1, according to the resent invention, even with narrow trowel width, the cover tape can be heat-sealed to a polycarbonate carrier tape at a sealing temperature lower by at least 30° C. than the presently employed sealing temperature, although the polycarbonate carrier tape has hitherto required a heat sealing temperature of about 200° C. Thus, the present cover tape can provide satisfactory performances.

What is claimed is:

1. A cover tape for packaging electronic elements capable of being heat-sealed to a polycarbonate carrier tape having regularly formed pockets for containing electronic elements, which cover tape comprises (A) a substrate layer comprising a thermoplastic resin having a load deflection temperature (ASTM D-648) under a load of 1.82 MPa of not lower than 60° C., and (B) a heat seal layer comprising at least one resin selected from polyvinyl chloride resin, polyester resin, polyurethane resin, acrylic resin containing a functional group and ethylene copolymer which have a Tg of 30–60° C., and an electroconductive fine powder dispersed in said resin.

2. A cover tape for packaging electronic elements according to claim 1, wherein the layer A has a thickness of 6–100 μm and comprises polycarbonate, polyether sulfone, polyether imide, polyimide, nylon, polyester or polypropylene.

3. A cover tape for packaging electronic elements according to claim 1, wherein at least one layer selected from the group consisting of a polyester layer, a nylon layer, a polypropylene layer, a polyethylene layer and an ethylene copolymer layer is laminated between the layer A and the layer B.

4. A cover tape for packaging electronic elements according to claim 1, wherein the comonomer of the ethylene copolymer is one member selected from the group consisting of vinyl acetate, acrylic acid, acrylate esters, methacrylic acid, methacrylate esters and ionomers.

5. A cover tape for packaging electronic elements according to claim 1, wherein the polycarbonate carrier tape has an electroconductive material incorporated and kneaded therein or coated on the surface of the tape.

6. A cover tape for packaging electronic elements according to claim 1, wherein the electroconductive fine powder contained in the layer B consists of at least one member selected from tin oxide, zinc oxide, titanium oxide and carbon black, and the surface of the seal layer B has a resistivity of not more that $1 \times 10^{13} \Omega/\square$.

7. A cover tape for packaging electronic elements according to claim 1, which has a total light transmittance of not less than 70% and a haze of not more than 60%.

* * * * *